(12) United States Patent
Licausi et al.

(10) Patent No.: US 9,553,194 B1
(45) Date of Patent: Jan. 24, 2017

(54) METHOD FOR IMPROVED FIN PROFILE

(71) Applicant: GLOBALFOUNDRIES Inc., Grand Cayman (KY)

(72) Inventors: Nicholas Vincent Licausi, Watervliet, NY (US); Zhenyu Hu, Clifton Park, NY (US); Hong Yu, Rexford, NY (US); Jinping Liu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/812,653

(22) Filed: Jul. 29, 2015

(51) Int. Cl.
*H01L 29/78* (2006.01)
*H01L 21/308* (2006.01)
*H01L 21/3065* (2006.01)
*H01L 29/06* (2006.01)
*H01L 21/8234* (2006.01)
*H01L 27/088* (2006.01)

(52) U.S. Cl.
CPC ....... *H01L 29/7853* (2013.01); *H01L 21/3065* (2013.01); *H01L 21/3081* (2013.01); *H01L 21/823431* (2013.01); *H01L 27/0886* (2013.01); *H01L 29/0657* (2013.01)

(58) Field of Classification Search
CPC .................. H01L 21/31144; H01L 21/31116; H01L 21/0337; H01L 21/3081; H01L 21/76802; H01L 29/66818; H01L 29/66795; H01L 21/76804; H01L 21/203; H01L 21/28194; H01L 21/31055; H01L 2224/0345; H01L 2224/03452; H01L 2224/03466; H01L 2224/03826; H01L 2224/03827
See application file for complete search history.

(56) References Cited

U.S. PATENT DOCUMENTS

| | | | | |
|---|---|---|---|---|
| 2009/0224357 A1* | 9/2009 | Juengling | ......... | H01L 29/66545 257/506 |
| 2013/0069144 A1* | 3/2013 | Mathew | .............. | H01L 29/7827 257/330 |
| 2014/0011341 A1* | 1/2014 | Maszara | ........... | H01L 29/66795 438/478 |
| 2014/0120677 A1* | 5/2014 | Pham | ................ | H01L 29/66795 438/283 |
| 2014/0252428 A1* | 9/2014 | Chang | ................... | H01L 29/785 257/288 |

* cited by examiner

*Primary Examiner* — Walter H Swanson
(74) *Attorney, Agent, or Firm* — Heslin Rothenberg Farley & Mesiti P.C.; Nathan B. Davis

(57) ABSTRACT

A method can include performing an etching process to define a fin trench having a first depth, the first depth being less that a target height of fin. A method can also include forming a layer to protect sidewalls defining the fin trench. A method can also include performing a second etching process to increase a depth of fin trench.

16 Claims, 9 Drawing Sheets

METHOD FOR IMPROVED FIN PROFILE

TECHNICAL FIELD

The present disclosure relates to a semiconductor structure and more particularly a method for formation of a semiconductor structure having an improved fin profile.

BACKGROUND OF THE INVENTION

For formation of a FinFET semiconductor structure a semiconductor substrate, a substrate can be provided. The substrate can be provided by silicon wafer. Fin trenches can be formed in the substrate to define fins. Fin trenches can be formed using an available etching technology. Hardmask layers can be used in the formation of trenches.

Formed fins that can be formed by way of trench formation can include a fin profile. In one aspect a fin profile can include a taper. A taper of a fin can increase with increases in fin height.

BRIEF DESCRIPTION

A method can include performing an etching process to define a fin trench having a first depth less that a target height of fin. A method can also include protecting sidewalls defining the fin trench. A method can also include performing a second etching process to increase a depth of the fin trench.

BRIEF DESCRIPTION OF THE SEVERAL VIEWS OF THE DRAWINGS

One or more aspects of the present disclosure are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
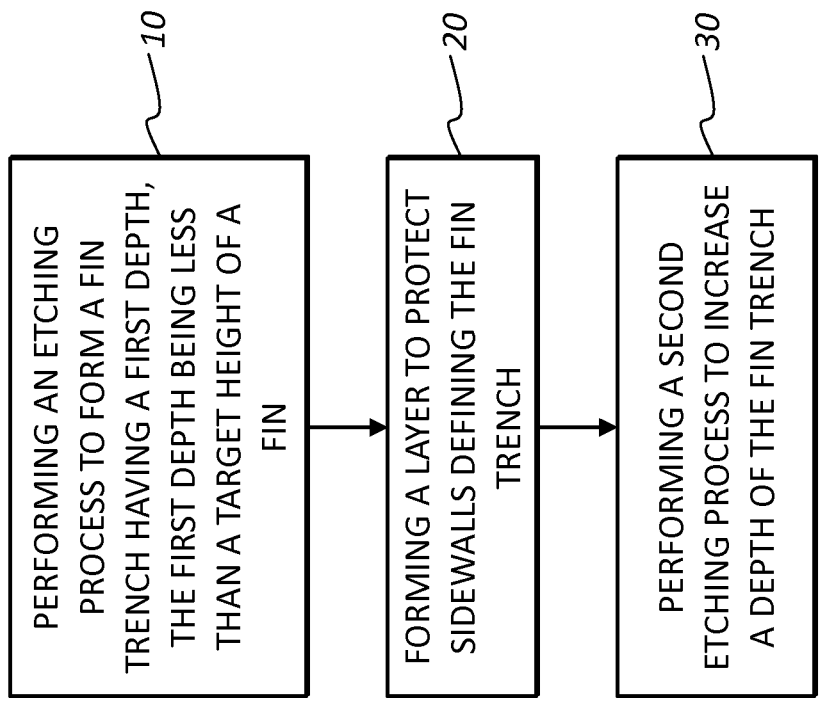
FIG. 1 is flow diagram illustrating a method for formation of a fin.

Referring to FIG. 1 a method can include at block 10 performing an etching process to form a fin trench having a first depth, the first depth being less than a target height of a fin. A method can also include at block 20 forming a layer to protect sidewalls defining the fin trench. A method can also include at block 30 performing a second etching process to increase a depth of the fin trench.

Figure 2:
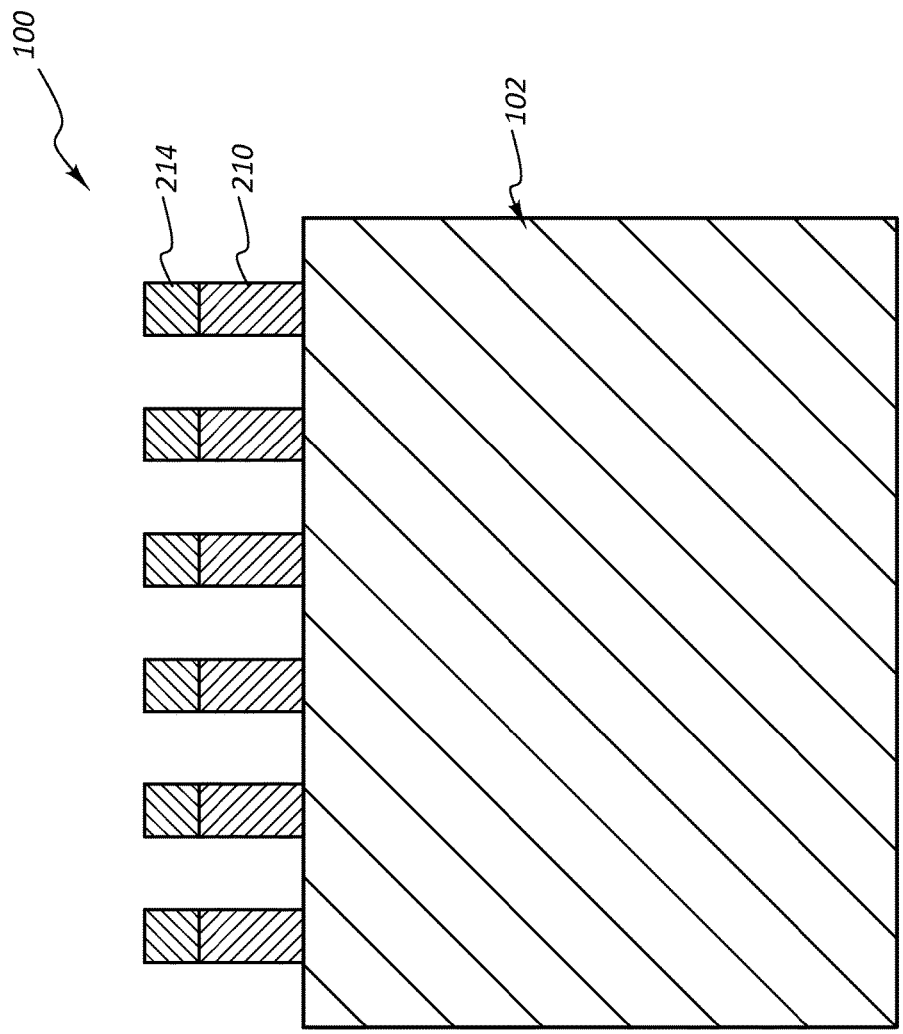
FIG. 2 is a fin widthwise cross sectional side view of a semiconductor structure in an intermediary stage of fabrication after formation of hardmask layers for fin trench formation.

FIG. 2 shows a semiconductor structure 100 in an intermediary stage of fabrication. Semiconductor structure 100 can include a substrate 102, hardmask layer 210 and hardmask layer 214. Hardmask layer 210 and hardmask layer 214 can be patterned hardmask layers that can define a pattern for formation of fin trenches and for formation of fins. Hardmask layer 210 and hardmask layer 214 can be formed of a dielectric material, e.g., oxide or nitride in one embodiment. In one embodiment, hardmask layer 210 and hardmask layer 214 can be formed of a common material. In one embodiment, hardmask layer 210 and hardmask layer 214 can be formed of different materials. In one embodiment, hardmask layer 214 can be replaced by a single hardmask layer, or a hardmask layer structure having a plurality of layers. Hardmask layer 210 and hardmask layer 214 can be formed using a sidewall image transfer (SIT) process in one embodiment. Substrate 102 can be formed, e.g., of silicon (si) or silicon germanium (SiGe).

Figure 3:
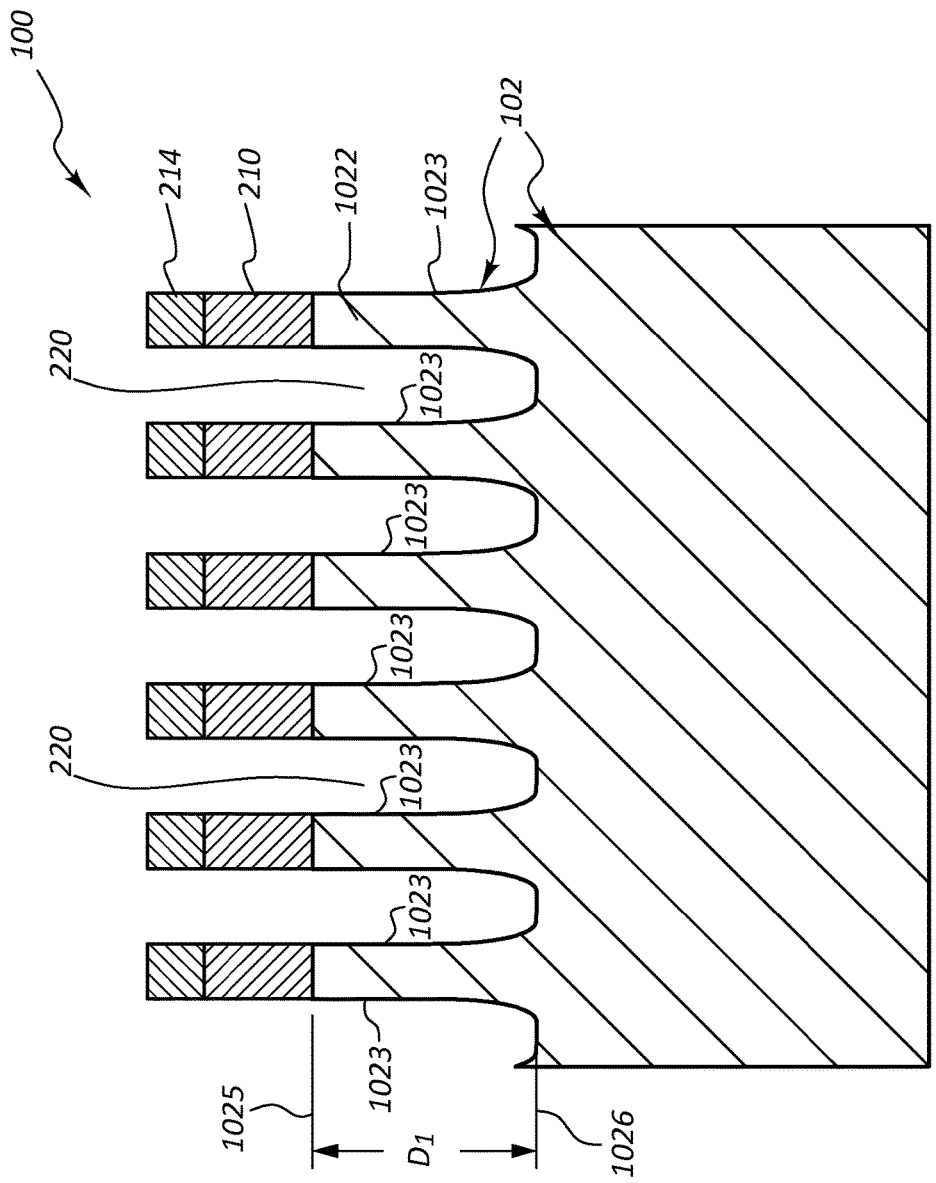
FIG. 3 is a fin widthwise cross sectional side view of a semiconductor structure in an intermediary stage of fabrication after performing an etching process for formation of fin trenches.

FIG. 3 shows the semiconductor structure 100 as shown in FIG. 2 after formation of fin trench 220. FIG. 3 illustrates performance of an etching process in accordance with block 10 (FIG. 1). In one embodiment, material of substrate 102 can be removed to define a fin trench 220. A plurality of fin trenches 220 can be formed in one embodiment. An etching process can be used to form trenches 220. With the formation of trenches 220 fins 1022 can be defined. In the stage shown in FIG. 3, trench 220 can have a first depth of $D_1$. The depth $D_1$ can be less than a target height of a fin 1022. A target height of a fin 1022 can be a height of fin 1022 when fabrication of fin 1022 has been completed.

In one embodiment, the depth $D_1$ can be substantial equal to target height of a chemical region of a fin. A target height of a channel region can be regarded as a height of a field effect transistor (FET) channel region when fabrication of the FET on semiconductor structure 100 has been completed. Elevation 1025 can be a top elevation of substrate 102 and fin 1022. Elevation 1026 can be a bottom elevation of fin trench 220 after performance of block 10 to form a fin trench 220 having a first depth.

In one aspect performing an etching process at block 10 can include terminating an etching process prior to a fin trench reaching a target height of a fin 1022.

Figure 4:
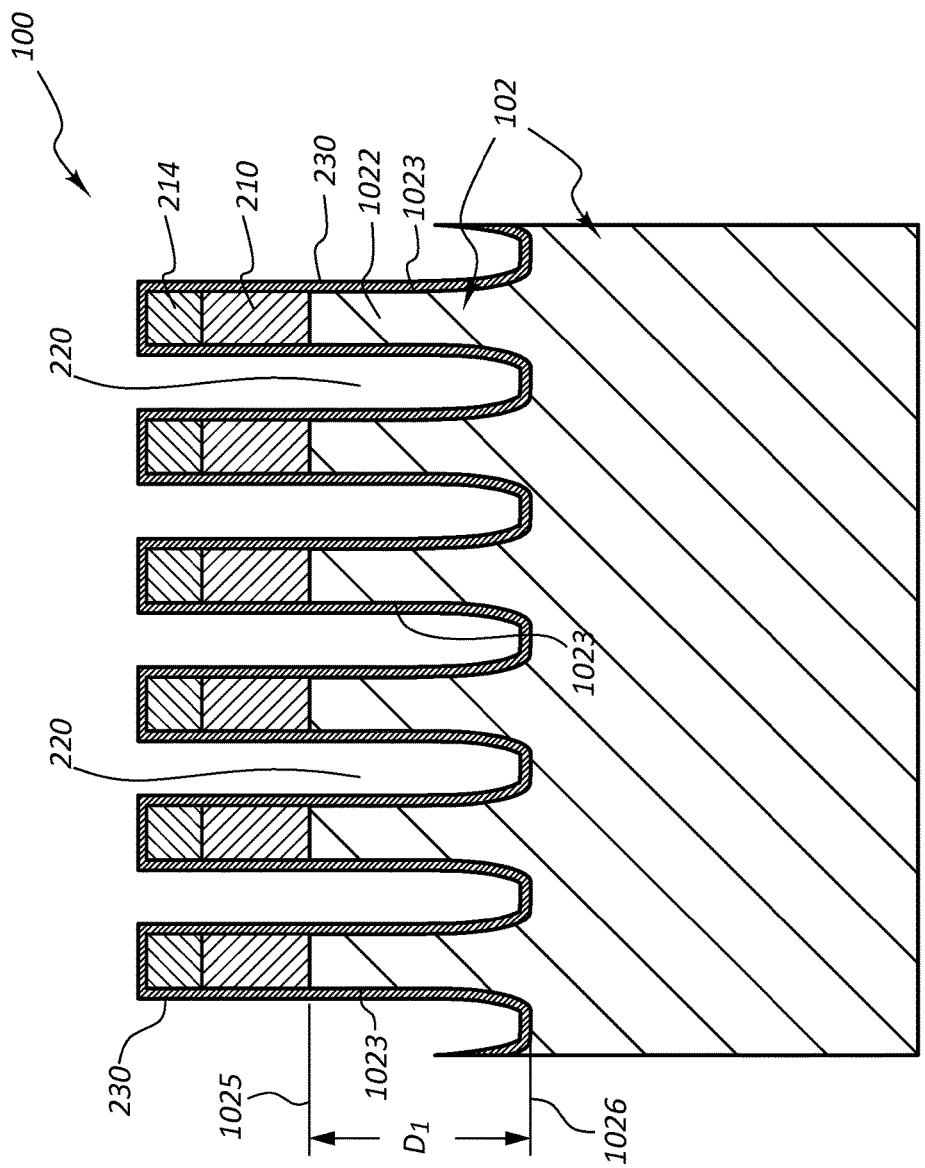
FIG. 4 is a fin widthwise cross sectional side view of a semiconductor structure in an intermediary stage of fabrication after formation of a layer to protect sidewalls defining a fin trench.

FIG. 4 illustrates semiconductor structure 100 as shown in FIG. 3 after formation of hardmask layer 230. FIG. 4 illustrates forming a layer to protect sidewalls 1023 defining fin trench 220 in accordance with block 20 in one embodiment. Hardmask layer 230 can be formed of a dielectric material, e.g., oxide or nitride in one embodiment. Hardmask layer 230 can be later removed and therefore can be regarded as sacrificial hardmask layer. Hardmask layer 230 can be conformally formed on fins 1022 so that sidewalls 1023 defining fin trenches 220 can be covered by hardmask layer 230. Sidewalls 1023 defining fin trenches 220 can also define fins 1022. Sidewalls 1023 defining fin trenches 220 and fins 1022 can be regarded a sidewalls 1023 of fin trenches 220 and can also be regarded sidewalls 1023 of fins 1022.

Figure 5:
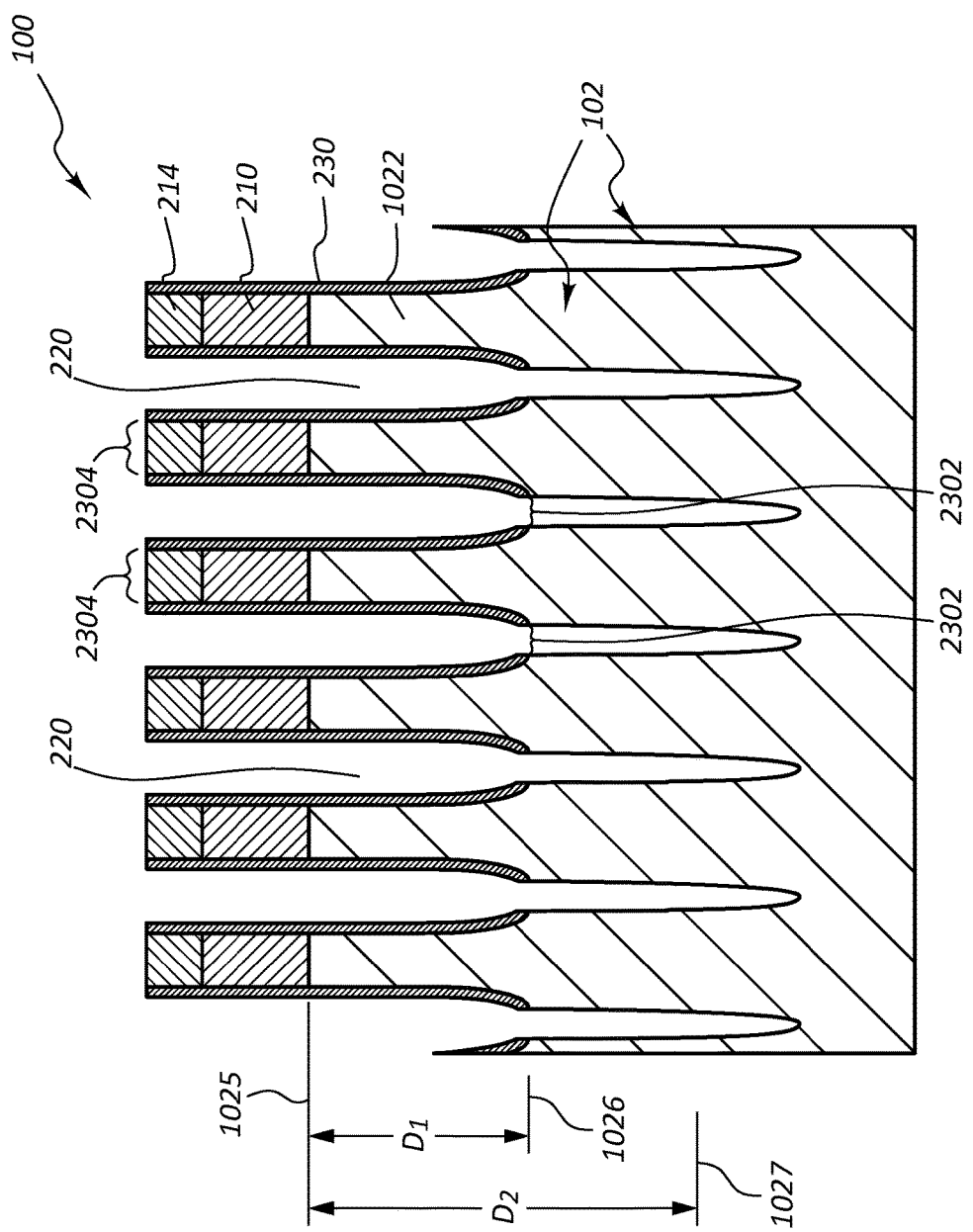
FIG. 5 is a fin widthwise cross sectional side view of a semiconductor structure in an intermediary stage of fabrication after performing a second etching process to increase a depth of a fin trench.

FIG. 5 illustrates semiconductor structure 100 as shown in FIG. 4 after performing further etching to increase a depth of a fin trench 220. FIG. 5 illustrates performing a second etch to increase depth of a fin trench 220 in accordance with block 30 in one embodiment. A high aspect ratio etching process can be used for the etching depicted in FIG. 5. Using a high aspect ratio etch process, etching of material in a vertical direction can be performed preferentially to etching of material in a horizontal direction. Accordingly, as shown in FIG. 5, material of hardmask layer 230 at a bottom of fin trench 220 and at a top of fin sections of hardmask layer 230 can be removed to define gaps 2302 of hardmask layer 230 within fin trench 220 and gaps 2304 of hardmask layer 230 at a top of a fin section of hardmask layer 230 without removal of substantial material sections of hardmask layer 230 covering and protecting sidewalls 1023. Hardmask layer 230 can remain to protect sidewalls 1023. With sidewalls 1023 protected, sidewalls 1023 can be made resistant to recessing during performance of block 30 to increase a depth of fin trench 220.

On completion of the etch process depicted in FIG. 5 a fin trench 220 can have a depth $D_2$. The depth of fin trenches 220 can define a height of fin 1022 so that on completion of the etch depicted in FIG. 5 fins 1022 can have a height of $D_2$. The height $D_2$ in one embodiment can be a target height of a fin 1022, i.e., a height of fin 1022 when fabrication of fin 1022 has been completed. The height $D_2$ in one embodiment can be selected independently of $D_1$.

Figure 6:
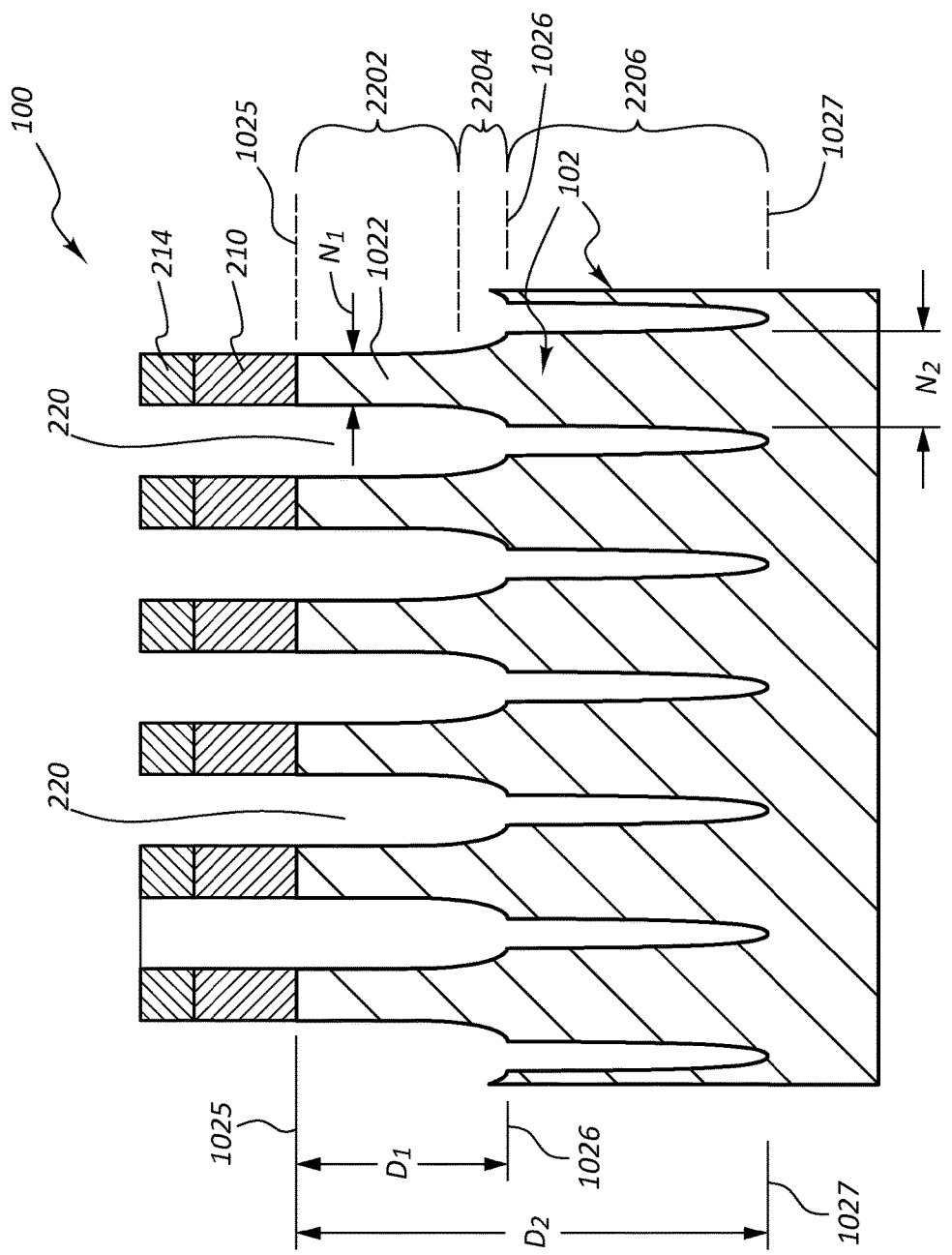
FIG. 6 is a fin widthwise cross sectional side view of a semiconductor structure in an intermediary stage of fabrication after removing of a hardmask layer.

FIG. 6 illustrates semiconductor structure 10 as shown in FIG. 5 after removal of hardmask layer 230. It is seen with reference to FIG. 6 that on removal of hardmask layer 230 fin trenches 220 can be defined that yield an improved profile for fin 1022. With the presence of hardmask layer 230 a taper of fin 1022 can be preserved so that fin 1022 exhibits a taper as would be expected in the case fins 1022 exhibited a fin height in completed form of $D_1$ (and not the actual fin height $D_2$ as shown in FIG. 6).

Referring to FIG. 6, a fin 1022 after fabrication of fin 1022 has been complete can exhibit a substantially step pattern fin profile. Fin 1022 can have a non-uniform fin taper angle. At elevation region 2202 fin 1022 can have a substantially uniform width $N_1$ and a substantially uniform fin taper angle. The fin taper angle at elevation region 2202 can be a substantially vertical fin taper angle in one embodiment. In one embodiment, a substantially vertical fin taper angle can be a fin taper angle of less than about 10 degrees. In one embodiment, a substantially vertical fin taper angle can be a fin taper angle of less than about 5 degrees. In one embodiment, a substantially vertical fin taper angle can be a fin taper angle of less than about 4 degrees. In one embodiment, a substantially vertical fin taper angle can be a fin taper angle of less than about 3 degrees. In one embodiment, a substantially vertical fin taper angle can be a fin taper angle of less than about 2 degrees. In one embodiment, a substantially vertical fin taper angle can be a fin taper angle of less than about 1 degree. Elevation region 2202 can be an elevation region above elevation 1026 and spaced apart from elevation 1026. Elevation 1026 can be an elevation of a bottom of fin trench 220 after performance of block 10.

At elevation region 2204 fin 1022 can have a changing fin taper angle. Elevation region 2204 can be a region adjacent to and above elevation 1026. A fin taper angle at elevation region 2204 can increase with decreasing elevation throughout elevation region 2204. At a top of elevation region 2204, fin 1022 can have a taper angle of less than 10 degrees. At a bottom of elevation region 2204, fin 1022 can have a taper angle of greater than 20 degrees, and in one embodiment, greater than 30 degrees, and in one embodiment, greater than 45 degrees, and in one embodiment, greater than 60 degrees, and in one embodiment, greater than 75 degrees. A taper angle at a bottom of elevation region 2204 can approach 90 degrees in one embodiment.

At elevation region 2206 fin 1022 can have a substantially uniform width $N_2$ and a substantially uniform fin taper angle. The fin taper angle at elevation region 2206 can be a substantially vertical fin taper angle in one embodiment. In one embodiment, a substantially vertical fin taper angle can be a fin taper angle of less than about 10 degrees. In one embodiment, a substantially vertical fin taper angle can be a fin taper angle of less than about 5 degrees. In one embodiment, a substantially vertical fin taper angle can be a fin taper angle of less than about 4 degrees. In one embodiment, a substantially vertical fin taper angle can be a fin taper angle of less than about 3 degrees. In one embodiment, a substantially vertical fin taper angle can be a fin taper angle of less than about 2 degrees. In one embodiment, a substantially vertical fin taper angle can be a fin taper angle of less than about 1 degree. In one embodiment, a fin taper angle at one or more of elevation region 2202 or elevation region 2206 can be other than a substantially uniform fin taper angle. In one embodiment, a fin taper angle at one or more of elevation region 2202 or elevation region 2206 can be other than a substantially vertical fin taper angle.

In one embodiment, a substantially uniform fin taper angle at elevation region 2206 can be greater than a substantially uniform fin taper angle at elevation region 2202, in one embodiment, more than 1 degree greater, in one embodiment, more than 2 degrees greater, in one embodiment more than 3 degrees greater, in one embodiment, more than 5 degrees greater.

Figure 7:
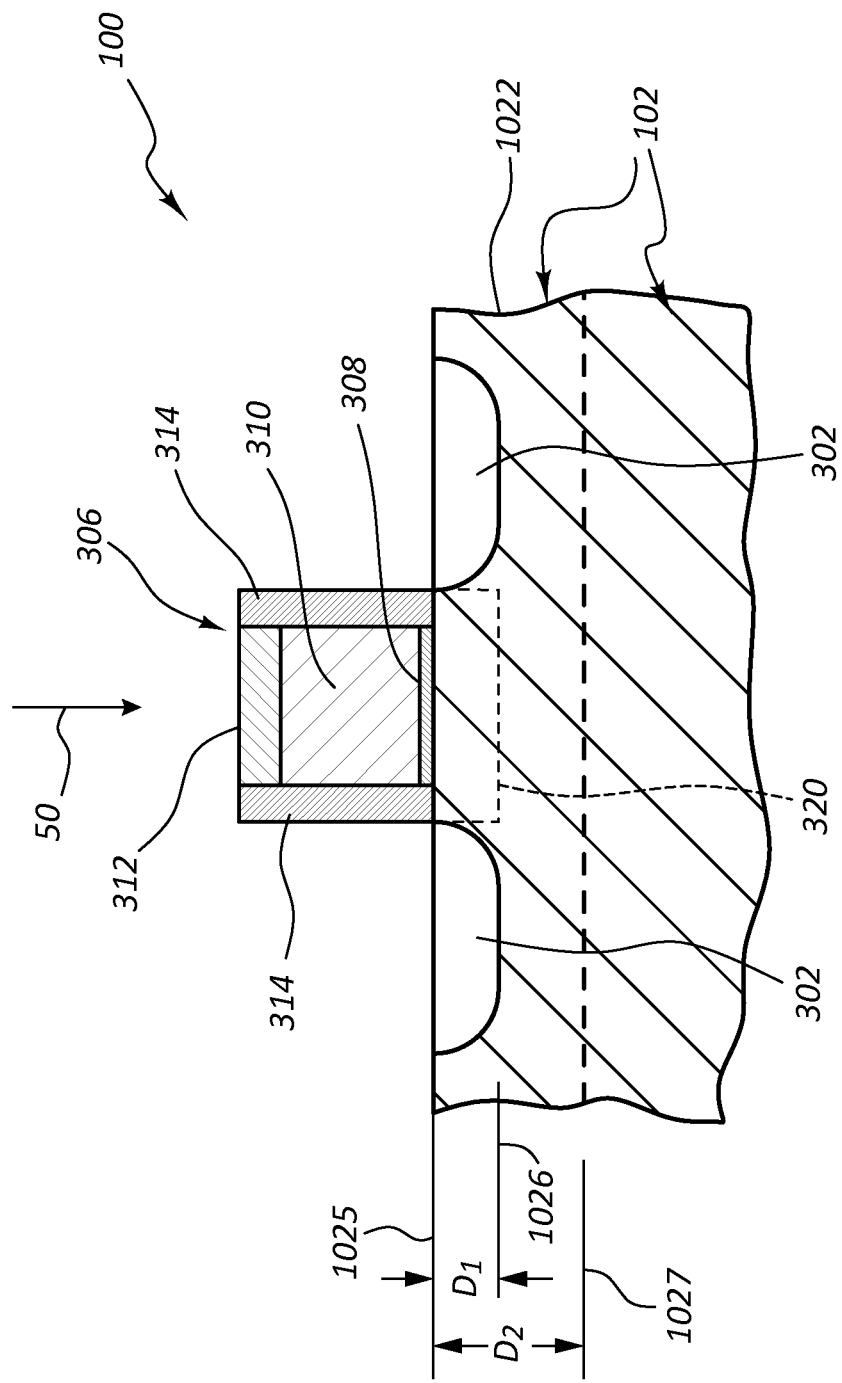
FIG. 7 is a fin lengthwise cross sectional side view of a semiconductor structure in an intermediary stage of fabrication after formation of a field effect transistor (FET) on a fin.

FIG. 7 illustrates semiconductor structure 100 as shown in FIG. 6 after fabricating of a field effect transistor (FET) 50 on fin 1022. Fabrication of FET 50 can include stages to form source-drains 302 and gates 306 having gate dielectric layer 308, one or more gate work function layer 310, gate capping layer 312, and gate spacers 314. Semiconductor structure 100 can include a substrate 102 having fins 1022 defined by formation of fin trenches 220 (not shown but in the foreground and background of the cross sectional view of FIG. 7). Elevation 1025 depicts a top elevation of substrate 102 and fin 1022. Elevation 1026 depicts a bottom elevation of fin trench 220 and fin 1022 after performance of block 10. Elevation 1027 depicts a bottom elevation of fin trench 220 and fin 1022 after performance of block 30. FET 50 can include a channel region 320. In one embodiment channel region 320 can have a channel height substantially equal to the first depth $D_1$, which as explained with reference to FIG. 1 can be the depth of fin trench 220 after performance of block 10. Semiconductor structure 100 can be configured so that elevation 1027 is substantially at a bottom elevation of channel region 320 in one embodiment.

Figure 8:
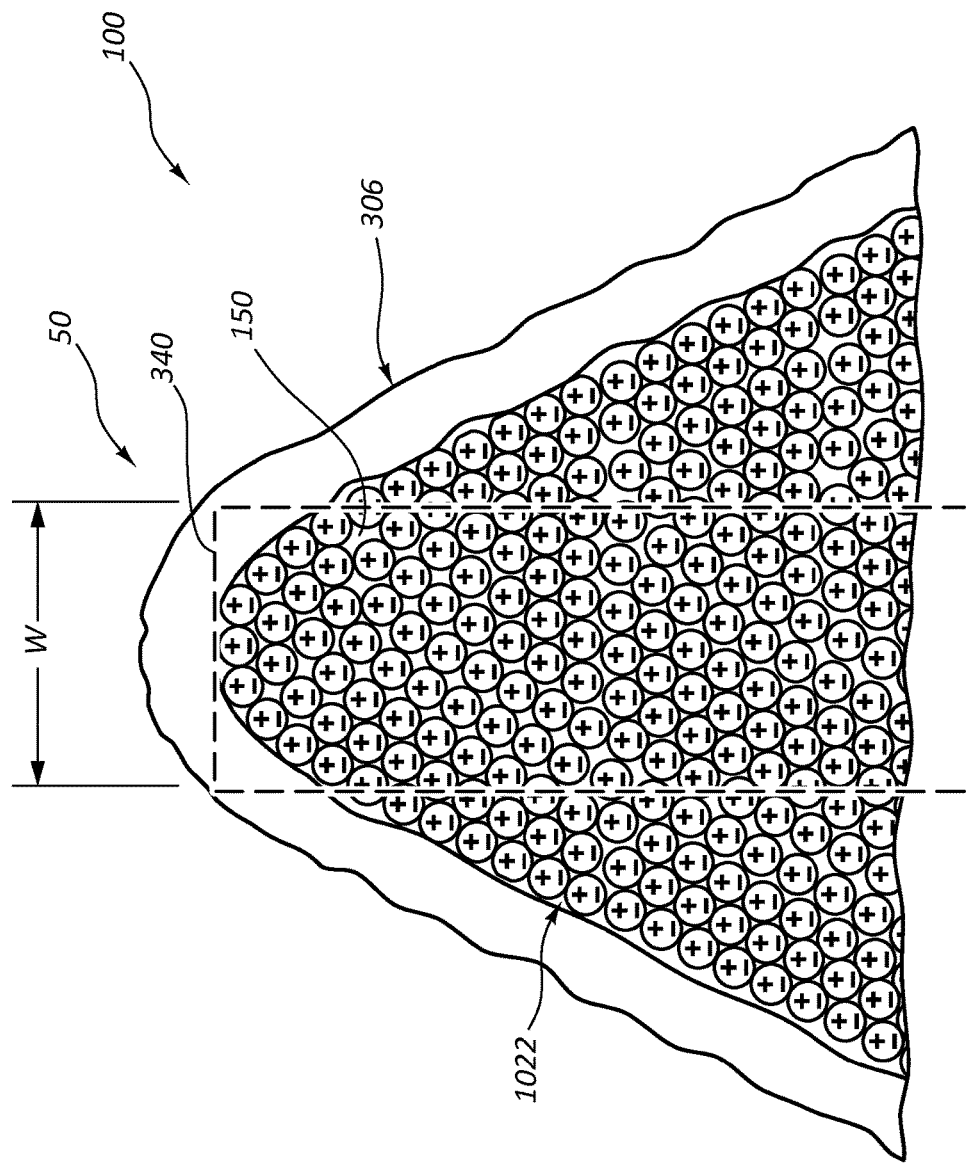
FIGS. 8 and 9 are fin widthwise cross-sectional views for illustrating a feature as set forth herein.
Figure 9:
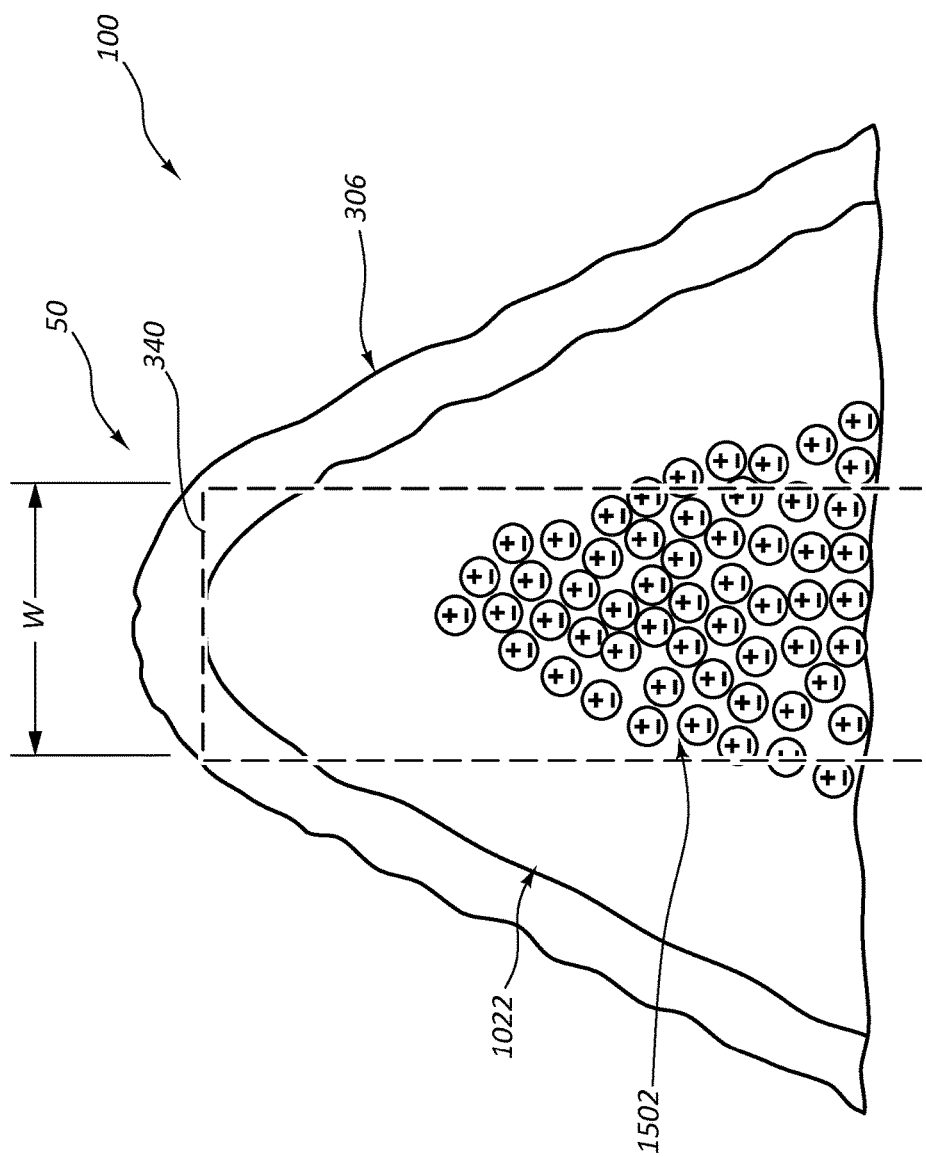

The formation of fins 1022 with a reduced taper can improve electrical performance of a FET 50. Referring to FIG. 8, fin 1022 can be designed to have an ideal rectilinear profile as depicted by dashed line 340. However, because of fin tapered resulting from increases in fin trench depth, fin 1022 can actually have a taper profile as depicted in FIG. 8. In such one embodiment, fin 1022 can have an ideal uniform width W but an actual width can be significantly larger than W in some sections of fin 1022 as depicted in FIG. 8. In an active mode of a FET 50 as shown in FIG. 8, charges 150 can be drawn into a location adjacent to gate 306 to define a channel allowing charges to pass between a first source-drain 302 (not shown but in a foreground of the cross sectional view of FIG. 8) and a second source-drain 302 (not shown but in the background of FIG. 8). In a depletion mode, charges are ideally no longer drawn to a location adjacent to gate 306, and FET 50 shuts off. That is, in a depletion mode, all changes can be ideally completely removed from fin 1022. However, with a significantly tapered fin profile as depicted in FIG. 8, problems can occur during depletion mode operation. In one aspect, gate 306 can be controlled in a depletion made to remove charges from fin 1022 based on fin 1022 having an ideal uniform width W. However, because a width of fin 1022 can be larger than W in some sections, all changes may not be removed during depletion made operation and residual charges 1502 as depicted in FIG. 9 can undesirably remain in a channel region of fin in a depletion mode. Because of residual charges 1502, a conductive path between first and second source-drains 302 may remain in a depletion mode. Accordingly, it can be seen that a fin taper approaching vertical can improved operation of semiconductor structure 100 at least by reducing risk of unwanted charges remaining in a fin 1022 in a depletion mode.

As has been described herein a first depth $D_1$, a depth of fin trench 220 after performance of block 10 can be provided so that $D_1$ is substantially equal to a target height of a channel region 320 as depicted in FIG. 7. Providing $D_1$ to be substantially equal to a target height of a channel region can be encourage the formation of sidewalls 1023 of fin 1022 that are substantially vertical in a section of fin 1022, the channel region 320, where a vertical profile can be particularly important to the operation of fin 1022. Providing sidewalls 1023 of a fin 1022 at a channel region 320 of fin 1022 to have substantially vertical taper angle can conserve power dissipation by FET 50 when FET 50 is controlled for flow of current through channel region 320. A substantially rectilinear profile in a channel region e.g., as described in connection with FIG. 6 can provide control and power consumption advantages as has been explained herein. In addition, a larger width $N_2$ at elevation region 2206 can e.g., provide a larger surface area for source-drain epi growth and/or for associated stressor structures.

Increases in fin trench depth can cause problems other than those relating to an increased fin taper. An increase in a fin trench depth can lead to fin shape and therefore device variability. As a fin trench depth increases it may become more difficult to repeat the dimensions of a device such as a FET from device to device. For example, source-drains that are often formed via epitaxial growth and/or implantation of impurities can be more likely to assume significantly different geometries from device to device as a fin trench depth is increased and as fin shape variability is correspondingly increased.

Each of the formed layers as set forth herein, e.g., layer 102, layer 210, layer 214 and/or layer 230, can be formed by way of deposition using any of a variety of deposition processes, including, for example, physical vapor deposition (PVD), atomic layer deposition (ALD), chemical vapor deposition (CVD), sputtering, or other known processes, depending on the material composition of the layer.

In one example, a protective mask layer as set forth herein, e.g., a mask layer for patterning layer 102, layer 210, layer 214 and/or layer 230 as set forth herein may include a material such as, for example, silicon, silicon nitride, silicon oxide, or silicon oxynitride, and may be deposited using conventional deposition processes, such as, for example, CVD or plasma-enhanced CVD (PECVD). In other examples, other mask materials may be used depending upon the materials used in semiconductor structure. For instance, a protective mask layer may be or include an organic material. In another example, a protective mask layer may be or include an organic polymer, for example, polyacrylate resin, epoxy resin, phenol resin, polyamide resin, polyimide resin, unsaturated polyester resin, polyphenylene ether resin, polyphenylenesulfide resin or benzocyclobutene (BCB).

Removing material of a layer as set forth herein, e.g., layer 102, layer 210, layer 214 and/or layer 230 can be achieved by any suitable etching process, such as dry or wet etching processing. In one example, isotropic dry etching may be used by, for example, ion beam etching, plasma etching or isotropic RIE. In another example, isotropic wet etching may also be performed using etching solutions selective to the material subject to removal.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features, and forms of the term "define" encompass relationships wherein an element is partially defined as well as relationships where an element is entirely defined. Furthermore, a device or structure that is configured in a certain way is configured in at least that way, but may also be configured in ways that are not listed. Methods and apparatus set forth herein as having a certain number of elements can be practiced with less than or more than the certain number of elements.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
performing an etching process to form a fin trench having a first depth, the first depth being less than a target height of a fin and substantially equal to a target height of a channel region;
forming a hardmask layer to protect sidewalls defining the fin trench; and
performing a second etching process using a high aspect ratio etching process to selectively remove material of the hardmask layer at a bottom of the fin trench to increase a depth of the fin trench.

2. The method of claim 1, wherein the performing the etching process includes using another hardmask layer having a pattern of the fin trench.

3. The method of claim 1, wherein the performing the etching process includes using another hardmask layer having a pattern of the fin trench, the another hardmask layer formed using sidewall image transfer.

4. The method of claim 1, wherein the forming the layer to protect includes forming material over the sidewalls defining the fin trench.

5. The method of claim 1, wherein the forming the layer to protect includes forming the hardmask layer over the fin.

6. The method of claim 1, wherein the forming the layer to protect includes conformally forming the hardmask layer over the fin.

7. The method of claim 1, wherein the performing the second etching process includes using a reactive ion etch (RIE) process.

8. The method of claim 6, wherein the hardmask layer comprises a sacrificial hardmask layer including a gap defined at the bottom of the fin trench.

9. The method of claim 6, wherein the hardmask layer comprises a sacrificial hardmask layer including a gap defined at a fin top section of the hardmask layer.

10. The method of claim 6, wherein the fin trench is formed within a substrate formed of silicon.

11. The method of claim 6 wherein the fin comprises:
a fin profile, wherein the fin profile is characterized by having a non-uniform fin taper angle; and wherein
a field effect transistor is formed on the fin.

12. The method of claim 11, wherein the fin includes an elevation region characterized by a changing fin taper angle.

13. The method of claim 11, wherein the fin includes an elevation region characterized by a changing fin taper angle, the elevation region being proximate a bottom of the channel region.

14. The method of claim 11, wherein the fin includes an elevation region characterized by a changing fin taper angle, the elevation region being proximate a bottom of the channel region, the fin having a second elevation region above the elevation region, the second elevation region characterized by having a substantially uniform fin taper angle.

15. The method of claim 11, wherein the fin includes an elevation region characterized by a changing fin taper angle, the elevation region being proximate a bottom of the channel region, the fin having a second elevation region above the elevation region, the second elevation region characterized by having a substantially uniform and substantially vertical fin taper angle.

16. The method of claim 11, wherein the fin includes a first elevation region characterized by a first width and a second elevation region characterized by a second width.

* * * * *